US012804874B2

(12) United States Patent
Ong et al.

(10) Patent No.: US 12,804,874 B2
(45) Date of Patent: Nov. 17, 2026

(54) RECESSED TRANSISTOR TERMINAL VIA JUMPERS

(71) Applicant: Intel Corporation, Santa Clara, CA (US)

(72) Inventors: Clifford Ong, Portland, OR (US); Leonard Guler, Hillsboro, OR (US); Mohit Haran, Hillsboro, OR (US); Smita Shridharan, Hillsboro, OR (US); Reken Patel, Portland, OR (US); Charles Wallace, Portland, OR (US); Chanaka Munasinghe, Portland, OR (US); Pratik Patel, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 279 days.

(21) Appl. No.: 17/711,875

(22) Filed: Apr. 1, 2022

(65) Prior Publication Data

US 2023/0320057 A1 Oct. 5, 2023

(51) Int. Cl.

| | |
|---|---|
| ***H10B 10/00*** | (2023.01) |
| ***G11C 11/412*** | (2006.01) |
| ***H10D 30/67*** | (2025.01) |
| ***H10D 89/10*** | (2025.01) |
| ***H10W 20/00*** | (2026.01) |
| ***H10W 20/42*** | (2026.01) |

(52) U.S. Cl.

CPC ............ *H10B 10/12* (2023.02); *G11C 11/412* (2013.01); *H10D 30/6735* (2025.01); *H10D 89/10* (2025.01); *H10W 20/056* (2026.01); *H10W 20/42* (2026.01)

(58) Field of Classification Search

CPC ............... H10D 89/10; H10D 84/0149; H10D 30/6735; H10D 30/62; H10B 10/12; H01L 21/76877; H01L 23/5226; H10W 20/42; H10W 20/0698; H10W 20/056

See application file for complete search history.

(56) References Cited

U.S. PATENT DOCUMENTS 6,479,873 B1 * 11/2002 Yoshiyama ....... H01L 21/76897 257/E21.507
2002/0079525 A1 * 6/2002 Mayuzumi ........ H01L 21/28114 257/E21.59
2003/0006444 A1 * 1/2003 Amo ...................... H10B 12/50 257/E27.098
2022/0223498 A1 * 7/2022 Li ..................... H01L 21/76802

* cited by examiner

*Primary Examiner* — John M Parker
(74) *Attorney, Agent, or Firm* — Essential Patents Group, LLP

(57) ABSTRACT

Integrated circuit (IC) devices include transistors with gate, source and drain contact metallization, some of which are jumpered together by a metallization that is recessed below a height of other metallization that is not jumpered. The jumper metallization may provide a local interconnect between terminals of one transistor or adjacent transistors, for example between a gate of one transistor and a source/drain of another transistor. The jumper metallization may not induce the same pitch constraints faced by interconnect line metallization levels employed for more general interconnection. In some examples, a static random-access memory (SRAM) bit-cell includes a jumper metallization joining two transistors of the cell to reduce cell height for a given feature patterning capability.

13 Claims, 9 Drawing Sheets

RECESSED TRANSISTOR TERMINAL VIA JUMPERS

BACKGROUND

Integrated circuit (IC) devices often include static random-access memory (SRAM). Microprocessor chips, for example, dedicate a significant amount of chip area to SRAM arrays as a lowest level cache storing bits for processing by arithmetic logic units (ALUs). An SRAM array includes a plurality of SRAM bit cells. FIG. 1 illustrates a conventional six-transistor (6T) SRAM bit-cell 100 that includes six transistors comprising two p-channel load or "pull-up" transistors 120 and four n-channel transistors that further comprise two drive or "pull-down" transistors 125 and two pass-gate transistors 130.

SRAM density is dependent on bit-cell height, which further depends on the minimum printable dimensions of lines and spaces for a given patterned feature layer, as well as overlay tolerances between successive patterned layers. In SRAM layouts, terminal contact metallization may be coupled to a first-level of interconnect metallization through a terminal contact via metallization while gate electrodes are coupled to the first-level interconnect metallization through a gate contact metallization. Accordingly, spacing between adjacent features of the first-level interconnect metallization can become a limiter of how small an SRAM bit-cell height can be scaled.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
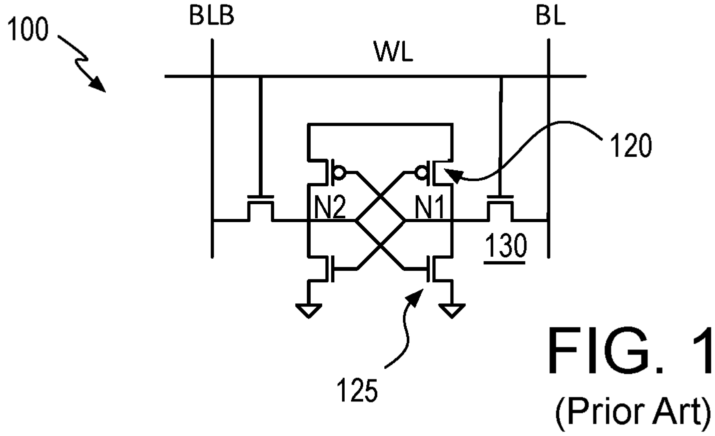
FIG. 1 (Prior Art)
FIG. 1 is a circuit schematic of a conventional 6T-SRAM bit-cell.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The term "adjacent" here generally refers to a position of a thing being next to (e.g., immediately next to or close to with one or more things between them) or adjoining another thing (e.g., abutting it).

As used in the description and the appended claims, the singular forms "a", "an" and "the" are intended to include the plural forms as well, unless the context clearly indicates otherwise. It will also be understood that the term "and/or" as used herein refers to and encompasses any possible combinations of one or more of the associated listed items.

The terms "coupled" and "connected," along with their derivatives, may be used herein to describe functional or structural relationships between components. These terms are not intended as synonyms for each other. Rather, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

The term "signal" may refer to at least one current signal, voltage signal, magnetic signal, or data/clock signal.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

Figure 2:
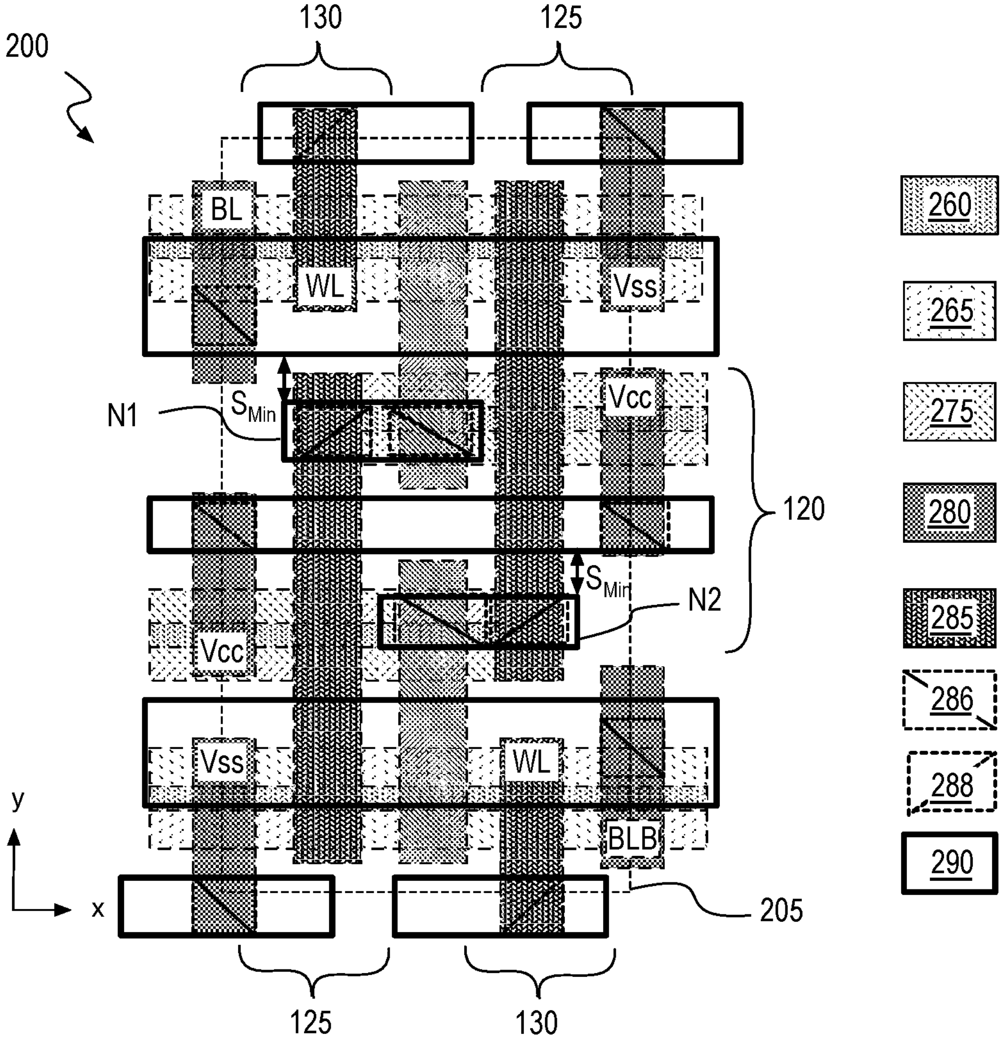
FIG. 2 is a plan view of a 6T-SRAM bit-cell layout illustrating a cell height that can become limited by dimensions of a first layer of interconnect lines and spaces.

FIG. 2 is a plan view of an 6T-SRAM bit-cell layout 200 with a cell height (e.g., y-dimension) that can become limited by the lateral dimensions of a first layer of interconnect lines and spaces. In 6-T SRAM layout 200, pull-down transistor 125 and pass-gate transistor 130 include separate regions of a nanoribbon 260. Pull-up transistors 120 comprise two separate nanoribbons 260. Pull-down transistor 125 and pass-gate transistor 130 each include active regions 265 surrounding nanoribbons 260. Although not illustrated, source/drain regions may extend some width beyond a sidewall of nanoribbons 260 to overlap active regions 265. Both the source/drain regions and active regions 265 comprise semiconductor, which may be of complementary conductivity type (e.g., p-type active region 265 and n-type source/drain impurity regions) for inversion devices or of the same conductivity type (e.g., n-type active region 265 and n-type source/drain impurity regions) for accumulation devices. As shown, a first semiconductor terminal (e.g., source) of pull-down transistor 125 is coupled to Vss through a terminal contact metallization 280. A first semiconductor terminal (e.g., source) of pass-gate transistor 130 is coupled to a bitline BL through terminal contact metallization 280.

A gate electrode 285 of pass-gate transistor 130 is coupled to a wordline WL. A second semiconductor terminal (e.g., drain) of pull-down transistor 125 and a second semiconductor terminal (e.g., drain) of pass-gate transistor 130 are coupled through terminal contact metallization 280 to one of the pull-up transistors 120. A gate electrode 285 of pull-down transistor 125 is coupled to pull-up transistors 120. In some examples where pass-gate transistors 130 and pull-down transistors 125 are both n-type/n-channel devices, pull-up transistors 120 are p-type/p-channel transistors comprising source/drain semiconductor (e.g., p-type) that is complementary to the source/drain semiconductor of transistors 125, 130.

In SRAM layout 200, terminal contact metallization 280 is coupled to a first-level interconnect metallization 290 through a terminal contact via metallization 286, while gate electrode 285 is coupled to first-level interconnect metallization 290 through a gate contact metallization 288. Interconnect metallization level 290 is illustrated in dark solid line to emphasize it is overlying the feature layers illustrated in dashed line. As shown, a space between adjacent features of first-level interconnect metallization 290 faces a minimum space dimensional constraint $S_{Min}$ when first-level interconnect metallization 290 interconnects the drain of a first pull-up transistor 120 to the gate electrode of a second pull-up transistor 120 at the storage nodes N1, N2. Accordingly, reducing the height of bitcell 205 relies on improving the lithographic patterning of first-level interconnect metallization 290 to allow $S_{Min}$ to scale down.

One option of scaling SRAM layer 200 is to propagate advanced lithography techniques (e.g., extreme ultraviolet) employed in the patterning of lower feature levels (e.g., nanoribbons 260 or gate electrode 285) to further pattern first-level interconnect metallization 290. However, advanced lithography is significantly more expensive than more mature lithography techniques (e.g., immersion employing longer wavelengths). Therefore, in accordance with some embodiments, transistors with gate, source, and drain contact metallization may instead be electrically shunted together by a jumper metallization feature that is recessed below a height of metallization of other transistor terminals that not similarly jumpered. In some exemplary embodiments, the jumper metallization is a local interconnect between a gate electrode of one transistor and source/drain terminal of that same transistor or an adjacent transistor. Since the gate-source/drain jumper metallization comprises a metal that is the result of a merge between a gate electrode contact metallization and a source/drain contact via metallization, the pitch constraints faced when one relies upon an interconnect metallization level employed for more general/global interconnection may be avoided. Also, rather than introducing a challenging new mask level to exclusively pattern a local interconnect, a relaxed mask level may be used to selectively recess jumper metallization that is already otherwise fully patterned as result of the gate contact-source/drain via merge.

Figure 3:
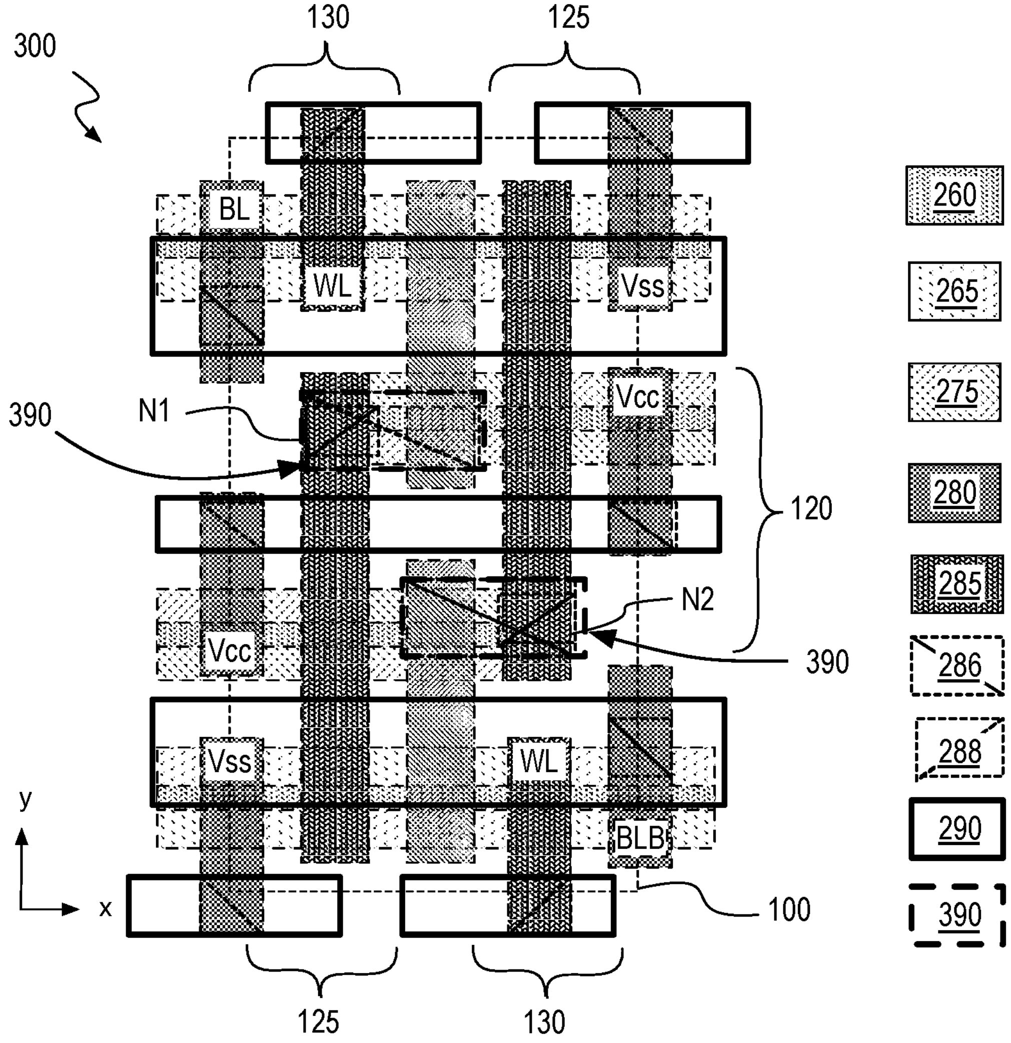
FIG. 3 is a plan view of a 6T-SRAM bit-cell layout with a terminal jumper metallization, in accordance with some embodiments.

While the transistor terminal jumper metallization described herein has many applications within IC devices, in some examples an SRAM bit-cell includes jumper metallization joining two transistors of the cell. FIG. 3 is a plan view of an exemplary 6T-SRAM bit-cell layout 300 with recessed transistor terminal jumper metallization 390 at storage nodes N1 and N2, in accordance with some embodiments. In SRAM layout 300, nanoribbons 260, active areas 265, 275, terminal contact metallization 280 and gate electrodes 285 are all substantially as described above in the context of SRAM layout 200. In SRAM layout 300, first-level interconnect metallization 290 is also present, but to a lesser extent than in SRAM layout 200. Specifically, pull-up transistors 120 are not coupled to each other through first-level interconnect metallization 290. Instead, pull-up transistor 120 are coupled through a terminal jumper metallization 390 that is illustrated in FIG. 3 with a dashed line to emphasize jumper metallization 390 is below first-level interconnect metallization 290 drawn in heavy solid line. As further illustrated, jumper metallization 390 is coupled to underlying terminal contact metallization 280 through source/drain contact via metallization 286. In contrast to SRAM layer 200 (FIG. 2) in SRAM layout 300, via metallization 286 overlaps gate contact metallization 288. As described further below, this illustrated merging of via metallization 286 and gate contact metallization 288 defines the lateral dimensions of jumper 390. As also described below, a portion of jumper metallization 390 is defined by gate contact metallization 288 even though gate contact metallization 288 is overlapped by via metallization 286.

By interconnecting the storage nodes N1, N2 with jumper metallization 390, first-level interconnect metallization 290 may be patterned with relaxed space rules as the minimum space constraint $S_{Min}$ of SRAM layout 200 is absent from SRAM layout 300. Without the minimum space constraint $S_{Min}$, SRAM layout 300 may enable a reduced cell height for a given feature patterning capability. Although some advantages of terminal jumper metallization are illustrated in the context of SRAM layout 300, such jumper metallization be integrated into any other functional circuit block where a gate electrode of one transistor is to be interconnected to a source/drain terminal of another transistor or to simply diode connect any single MOSFET (p-type or n-type).

Figure 4:
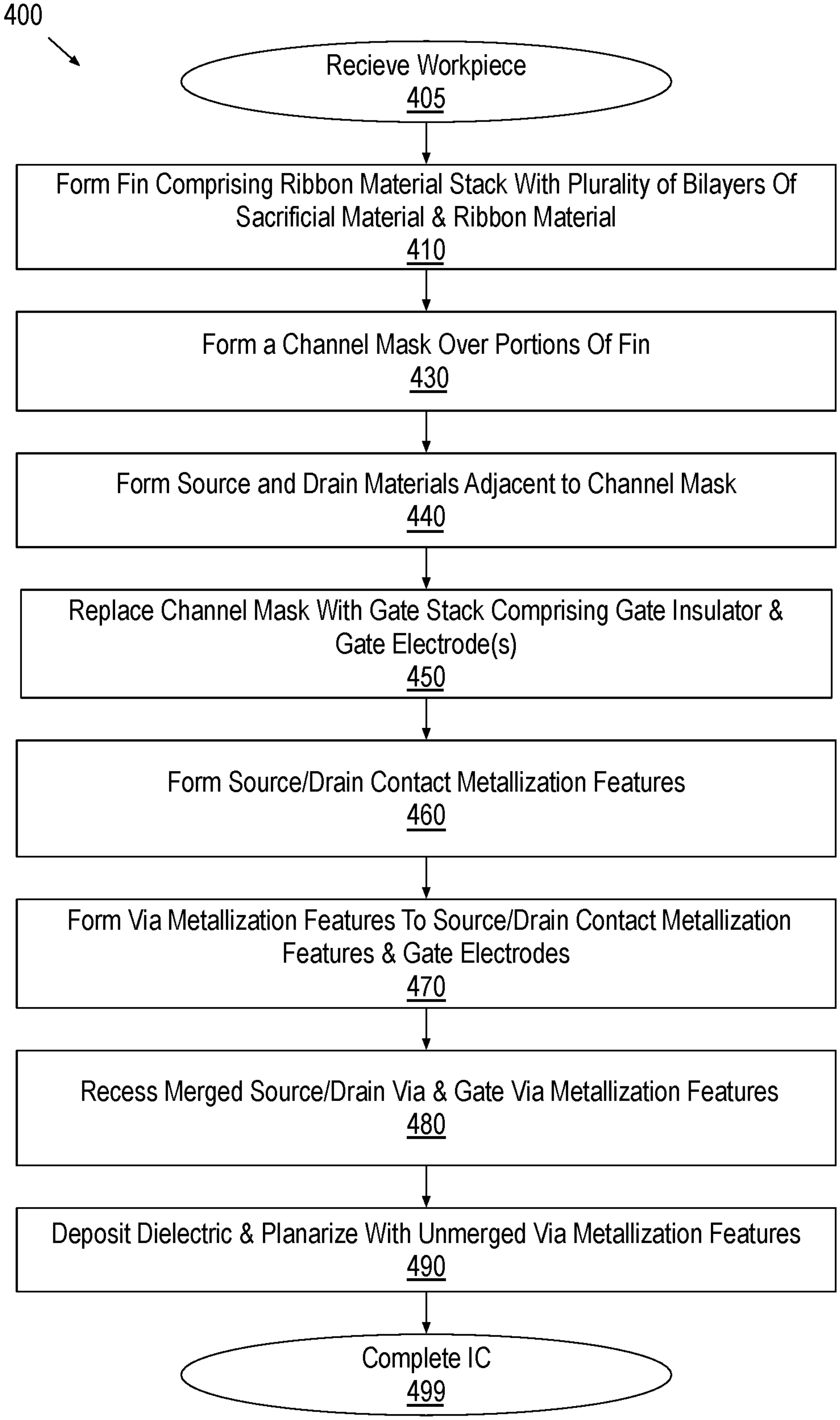
FIG. 4 is a flow diagram illustrating a method of fabricating transistors including transistor terminal jumper metallization, in accordance with some embodiments.

FIG. 4 is a flow diagram illustrating methods 400 for fabricating transistor structures including transistor terminal jumper metallization, in accordance with some embodiments. Methods 400 begin at input 405 where a workpiece is received. In some embodiments, the workpiece received at input 405 is a wafer suitable for IC die fabrication. The workpiece may, for example, further include part of a workpiece substrate (e.g., a large format semiconductor wafer) that is to become an IC chip. At block 410, a nanoribbon material stack is formed. The nanoribbon material stack may advantageously include a plurality of bi-layers comprising a sacrificial material and ribbon material. In some embodiments, the sacrificial material layers include more germanium than the ribbon material. For example, where the ribbon material is predominantly silicon, the sacrificial layers are $Si_{1-x}Ge_{X}$. The ribbon material stack may be patterned into one or more fins. Any patterning process, such as an EUV lithography process, may be practiced at block 420 to define a fin mask. Any subtractive etch may be practiced at block 420 to delineate features (e.g., fins) into the nanoribbon material stack. In some embodiments, a plasma etch process may be utilized to define such features.

At block 430, channel portions of the features patterned at block 410 are protected with a channel mask. In some embodiments, the channel mask formed over exposed portions of the fin includes a sacrificial gate stack. At block 440, source and drain regions are formed adjacent to the channel mask, for example by epitaxially growing impurity-doped semiconductor with a low-pressure CVD (LPCVD) process. Source and drain regions grown at block 430 may include predominantly silicon. One or more n-dopants (e.g., phosphorus, arsenic, or antimony) and/or one more p-dopants (e.g., boron) may be introduced into the source and drain materials during their deposition or growth.

At block 450, the channel mask and sacrificial material is removed to expose channel regions of the nanoribbons and a gate stack comprising a gate insulator and a gate electrode is formed around the channel regions of the transistor structures. The gate insulator may be formed with a chemical oxide growth processes and/or atomic layer deposition processes. The gate electrode may be formed with one or more deposition processes, such as, but not limited to, atomic layer deposition or physical vapor deposition. As illustrated in FIG. 3, the gate stack, and more specifically gate electrode 285, may be advantageously defined into line having a longitudinal length (e.g., along y-axis) that is at least twice its transverse width (e.g., along x-axis). In SRAM layout 300, for example, gate electrode 285 is patterned to have a length traversing more than one nanoribbon 260.

At block 460, terminal contact metallization is formed to contact the source and drain regions of individual ones of the transistor structures. In some examples, the terminal contact metallization is formed after forming the gate electrodes, but this exemplary order may also be reversed. Terminal contact metallization may be formed by patterning an opening through a dielectric layer and filling that opening with metallization of any suitable composition, for example with an atomic layer deposition process or physical vapor deposition process. In alternative embodiments, terminal contact metallization may be formed by depositing a metallization of any suitable composition and subtractively patterning the metallization. In exemplary embodiments, terminal contact metallization defined into a line having a longitudinal length (e.g., along y-axis) that is at least twice its transverse width (e.g., along x-axis). In SRAM layout 300 (FIG. 3), for example, terminal contact metallization 280 is defined into lines having a length sufficient to span a space between adjacent lines of first-level interconnect metallization 290. In alternative embodiments, terminal contact metallization may be defined into a pillar with lateral dimensions that are nearly equal along orthogonal dimensions within a plane parallel to the workpiece.

Figure 5A:
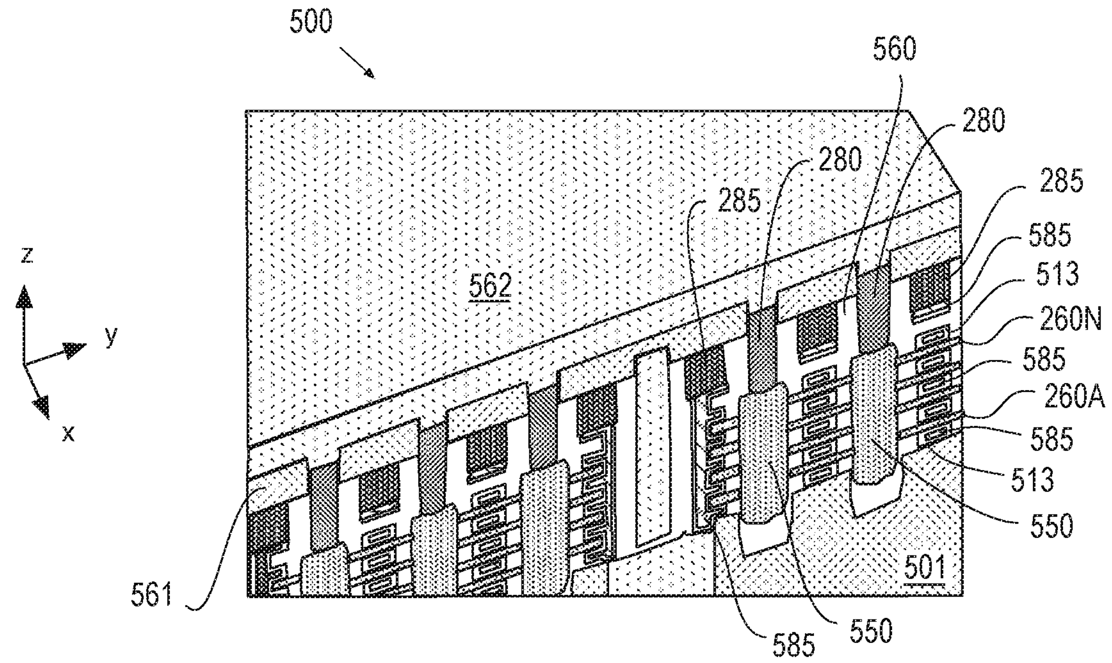
FIGS. 5A, 5B, 5C, 5D, 5E and 5F illustrate isometric-sectional views of transistor structures evolving as the methods illustrated in FIG. 4 are practiced, in accordance with some embodiments.

FIG. 5A illustrates an isometric-sectional view of transistor structures 500 as fabricated through block 460 of methods 400 (FIG. 4), in accordance with some nanoribbon transistor embodiments. In FIG. 5A, the sectional plane is a "gate-cut" plane that passes through a transverse width of gate electrodes 285 and through a longitudinal length of nanoribbons 260. Reference numbers in FIG. 5A are retained from FIG. 3 where a feature illustrated in FIG. 3 is also illustrated in FIG. 5A.

As shown in FIG. 5A, transistors structures 500 have a stacked, gate-all-around transistor architecture. Nanoribbons 260 include an uppermost nanoribbon 260N stacked vertical over a lowest nanoribbon 260A. The exemplary ribbon-or-wire (RoW) transistor stack structure is illustrated as including four nanoribbons, but such a transistor stack structure may include any integer number of channel regions (e.g., 2, 3, 4, 5 . . . 10 . . . 20, etc.) as embodiments herein are not limited in this respect.

In some embodiments, nanoribbons 260 are crystalline semiconductor. Although the crystalline semiconductor includes polycrystalline thin film material, the crystalline semiconductor may be advantageously substantially monocrystalline. In some such embodiments, the crystallinity of nanoribbons 260 is cubic with the top surfaces having crystallographic orientation of (100), (111), or (110), for example. Other crystallographic orientations are also possible. In some embodiments, nanoribbons 260 are a substantially monocrystalline group IV semiconductor material, such as, but not limited to substantially pure silicon (e.g., having only trace impurities), silicon alloys (e.g., SiGe), germanium alloys (GeSn), or substantially pure germanium (e.g., having only trace impurities).

Nanoribbons 260 may also have any of these same exemplary compositions in alternative polycrystalline or amorphous embodiments, for example where the stack of nanoribbons 260A-260N has been fabricated from a stack of thin film semiconductor material layers. Polycrystalline or amorphous embodiments of nanoribbons 260 may also include semiconducting metal oxides, such as IGZO. Although nanoribbons 260 are illustrated as having a substantially homogenous composition, they may alternatively comprise one or more semiconductor heterojunctions that, for example further include a first semiconductor material adjacent to a second semiconductor material.

Sub-channel material 501 is under the stack of nanoribbons 260. Sub-channel material 501 may have any composition and/or microstructure. For example, in some embodiments where nanoribbons 260 are of a Group IV material (e.g., silicon), sub-channel material 501 is also a Group IV material (e.g., silicon). In some further embodiments where nanoribbons 260 are substantially monocrystalline, sub-channel material 501 is also substantially monocrystalline, and has the same crystallinity and/or crystal orientation as that of nanoribbons 260. In alternative embodiments, sub-channel material 501 is a buried insulator layer (e.g., $SiO_2$), for example of a semiconductor-on-insulator (SOI) substrate.

A channel region of nanoribbons 260A-260N is surrounded by a gate stack that includes gate insulator 513 and gate electrode 285. Gate electrode 285 may further include any suitable workfunction metal 585, which co-axially clads the insulator-clad channel regions of nanoribbons 260 to provide gate-all-around control of channel conductivity. The chemical composition of workfunction metal 585 may vary between PMOS and NMOS devices as embodiments herein are not limited to any particular workfunction metal composition. As shown, a cap metal different than workfunction metal 585 may be at the top of gate electrode 285, and may have any chemical composition of suitably high electrical conductivity.

Gate insulator 513 may have any composition, and may, for example, include a high-k material (e.g., with a bulk relative permittivity greater than 8). The high-k material composition(s) may be any known to be suitable for a transistor gate insulator and that has a bulk relative permittivity greater than 8. One exemplary high-k material has a composition of $M1O_x$ where M1 is a transition or rare earth metal. Examples include a metal oxide comprising predominantly hafnium (e.g., $HfO_x$), a metal oxide comprising predominantly aluminum (e.g., $AlO_x$), a metal oxide comprising predominantly magnesium (e.g., MgO), a metal oxide comprising predominantly lanthanum (e.g., $LaO_x$), or a metal oxide comprising predominantly zirconium (e.g., $ZrO_x$). In other examples, the high-k material is an alloyed metal oxide comprising primarily two or more metals (e.g., $HfAlO_x$, $HfZrO_x$). In some further embodiments, the high-k material further includes silicon. For example, metal silicates, such as, but not limited to $HfSiO_x$, or $ZrSiO_x$, may also be suitable a high-k material for insulators 513.

Source/drain material 550 is at terminal ends of nanoribbons 260A-260N, on opposite sides of the gate stack. In accordance with the illustrated embodiment, all nanoribbons 260A-260N are coupled together in electrical parallel. The cumulative cross-sectional channel area is therefore a function of ribbon count, ribbon thickness (e.g., z-dimension) and ribbon width (e.g., x-dimension), which are both substantially the same in the illustrated embodiment. Source/drain material 550 is an impurity doped semiconductor, which is electrically and physically coupled to opposite sides of channel regions of nanoribbons 260A-260N. In this example, source/drain material 550 comprises faceted epitaxial material that has been grown, for example laterally from an end portion of channel regions, and/or from cantilevered source/drain ends of nanoribbons 260A-260N, and/or from sub-channel material 301. Source/drain material 550 need not be epitaxial material, in which case facets may not be present. Source/drain material 550 also need not merge into a unitary body, in which case cantilevered source/drain nanowire ends may be individually in contact with terminal contact metallization 280.

Source/drain material 550 may be comprise one or more electrically active impurities. In some embodiments, for example, source/drain material 550 may be a Group IV semiconductor material (e.g., Si, Ge, SiGe or GeSn alloy). For NMOS transistor structures, source/drain material 550 may comprise any n-type impurity dopant(s) and for PMOS transistors structures, source/drain material 550 may comprise any p-type impurity dopant(s).

FIG. 5A further illustrates terminal contact metallization 280. Terminal contact metallization 280 is substantially coplanar with the top (i.e., cap) portion of gate electrode 285. In exemplary embodiments, terminal contact metallization 280 of one or more compositions is in contact with source/drain material 550 of each transistor structure. For example, terminal contact metallization 280 of a first composition may be in contact a source/drain material 550 of a PMOS transistor structure and terminal contact metallization 280 of a second composition may be in contact with source/drain material 550 of an NMOS transistor structure. In other embodiments, all instances of terminal contact metallization 280, regardless of whether in contact with source/drain material 550 of a PMOS or an NMOS transistor structures, have the same composition.

As illustrated in FIG. 5A, terminal contact metallization 280 extends through a dielectric material 560 to be in contact with source/drain 550. The top surface of dielectric material 560 is coplanar with a top surface of gate electrodes 285. Dielectric material 560 may have any composition, such as $SiO_x$, SiON, SiN, $SiO_xCH$, amorphous carbon, MSQ, HSQ, etc. In the illustrated example, another dielectric material 561 is over a top surface of gate electrodes 285. However, dielectric material 561 does not cover terminal contact metallization 280. A sidewall of an upper portion of terminal contact metallization 280 is instead laterally adjacent to dielectric material 561. This structural relationship is indicative of gate electrodes 285 having been formed prior to the formation of dielectric material 561, and prior to the formation of terminal contact metallization 520.

Dielectric material 561 may also have any composition, such as, $SiO_x$, SiON, SiN, $SiO_xCH$, amorphous carbon, MSQ, HSQ, etc. In exemplary embodiments, dielectric material 561 has a different composition than dielectric material 560. Another dielectric material 562 is over dielectric material 561 as well as terminal contact metallization 280. Dielectric material 562 may also have any composition, such as, $SiO_x$, SiON, SiN, $SiO_xCH$, amorphous carbon, MSQ, HSQ, etc. In exemplary embodiments, dielectric material 562 has a different composition than dielectric material 561. In some such embodiments, dielectric material 562 may have the same composition as dielectric material 560. Alternatively, dielectric materials 506, 561 and 562 may have three distinct chemical compositions.

Returning to FIG. 4, methods 400 continue at block 470 where openings are formed to both the terminal contact metallization and to the gate electrodes. In exemplary embodiments, one or more dielectric materials that are over the terminal contact metallization is patterned according to a first lithographic mask patterning process. This patterning process may advantageously define openings in an etch mask. The dielectric material(s) over the terminal contact metallization is etched according to the etch mask, exposing the terminal contact metallization at the bottom of the opening. In exemplary embodiments, a subset of the via openings have lateral dimensions sufficient to be over both the terminal contact metallization and a laterally adjacent gate electrode, which may either be part of the same transistor as that of the terminal contact metallization, or part of a different transistor than that of the terminal contact metallization. Another subset of the via openings over the terminal contact metallization have lateral dimensions insufficient to be over laterally adjacent gate contact metallization.

Figure 5B:
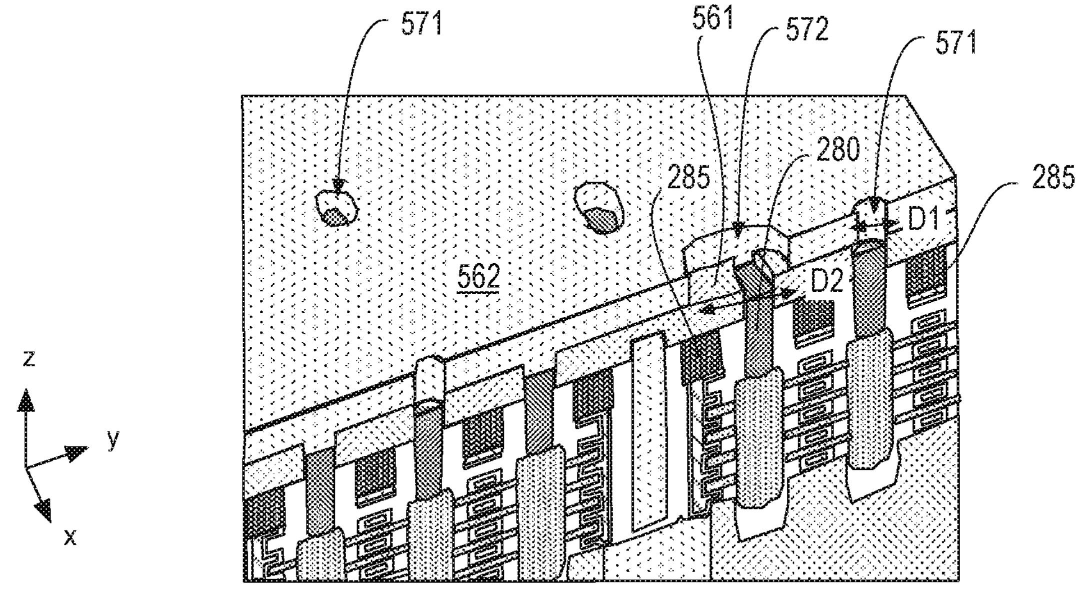

In the example further illustrated in FIG. 5B, transistor structures 500 have progressed to include both terminal contact via openings 571 of a dimension D1 and terminal contact via openings 572 of a dimension D2. As shown, dimension D2 is along the y-axis and is larger than dimension D1 (also along the y-axis) by an amount sufficient to ensure dielectric material 562 is removed from over at least a portion of an underlying gate electrode 285. With the dimension D1, terminal contact via openings 571 expose only a terminal contact metallization 280, for example associated with a first transistor. With dimension D2, terminal contact via opening 572 overlaps both a terminal contact metallization 280 and one adjacent gate electrode 285, which in this example is associated with a second transistor. In exemplary embodiments, terminal contact via openings 571 and 572 are formed with an etch process that removes dielectric material 562 at a higher rate than dielectric material 561. Accordingly, terminal contact via opening 571 exposes terminal contact metallization 280, but stops on dielectric material 561. Gate electrode 285 is therefore not exposed by terminal contact via opening 572. As such, terminal contact vias are essentially self-aligned to portions of terminal contact metallization 280 that are not covered by dielectric material 561.

Figure 5C:
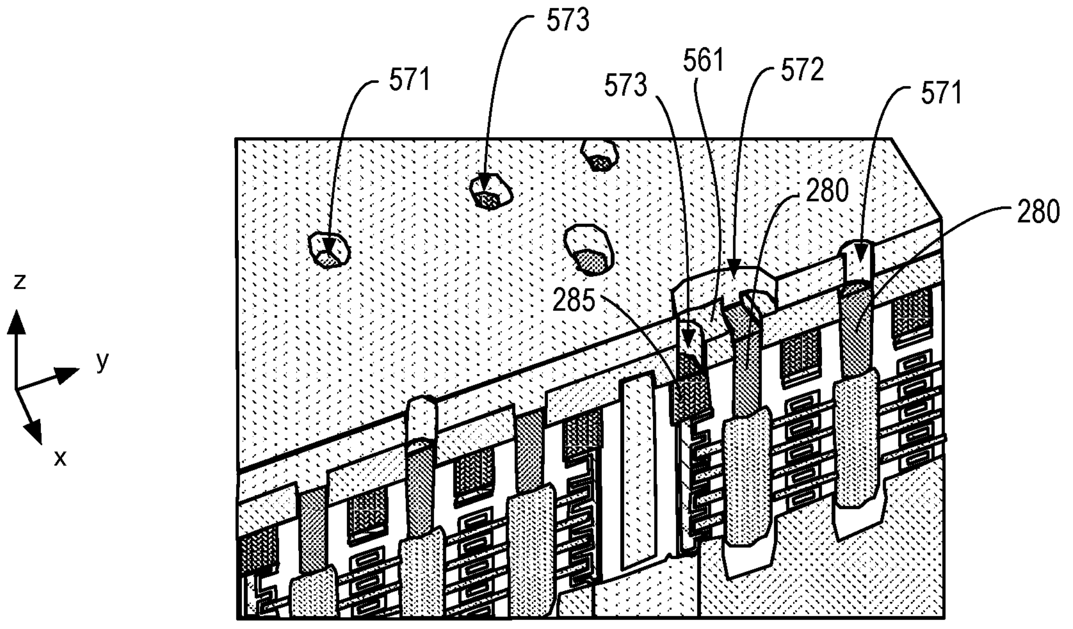

FIG. 5C further illustrates transistor structures 500 following patterning of gate contact openings 573. As shown, a subset of the gate contact openings 573 overlap, or merge with, terminal contact via openings 572. Although in the illustrated example gate contact openings 573 are all substantially the of the same dimension D3, gate contact openings 573 may instead have a variety of lateral dimensions, for example to ensure some gate contact openings 573 merge with terminal contact via openings 572. In exemplary embodiments, gate contact openings 573 are formed with an etch process that removes both dielectric material 562 and dielectric material 561. Gate electrode 285 is therefore exposed by gate contact openings 573. Where a gate contact opening 573 overlaps or merges with a terminal contact via opening 572, there is a region where dielectric material 562 is absent but the underlying dielectric material 561 remains between the two openings.

A metal is deposited into the gate contact openings to form gate contacts. The metal may be concurrently deposited into the terminal contact via openings to form terminal contact vias. Any metal suitable for the application may be deposited as embodiments are not limited in this regard. In some examples, the metal has the same composition as the gate electrode (e.g., cap material), or a terminal contact metallization. In other embodiments, the metal has a composition distinct from both the gate electrode and terminal contact metallization. Following deposition, metal overburden may be polished off with any suitable planarization process so that a top surface of the via metallization and contact metallization is coplanar with top surface of surrounding dielectric material. In the example further illustrated in FIG. 5D, transistor structures 500 have progressed to include terminal contact via metallization 286 in contact with a terminal contact metallization 280, a gate contact metallization 288 in contact with a gate electrode 285, and a gate-source/drain terminal jumper metallization 390 that is in contact with both a gate electrode 285 and a terminal contact metallization 280.

Figure 5D:
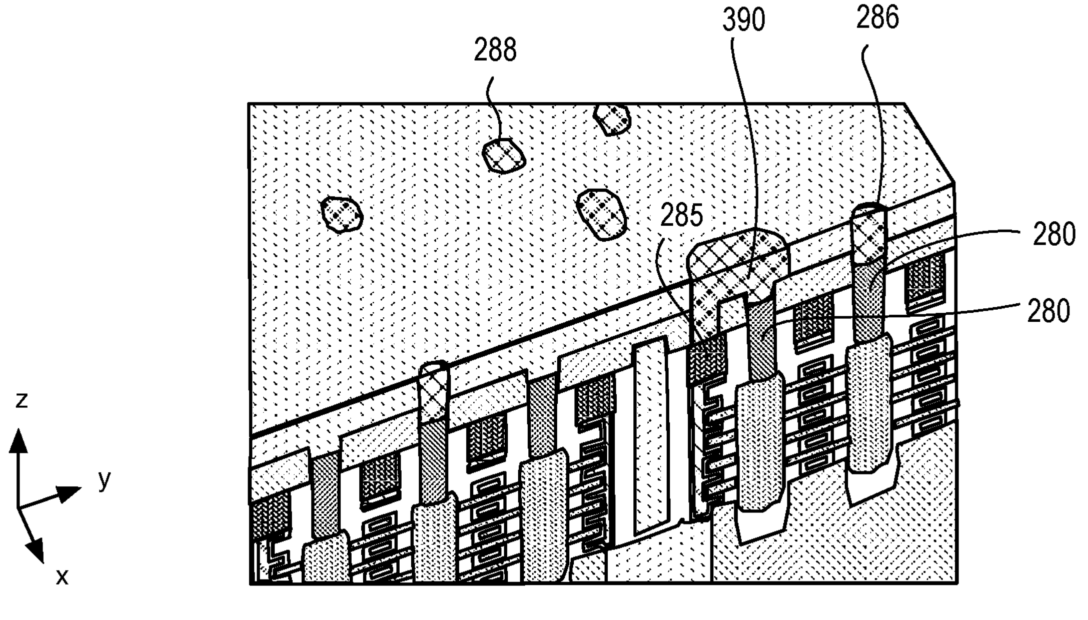

In alternative embodiments, patterning of gate contacts may follow the rubric described above for terminal contact via openings while the patterning of terminal contact openings follows the rubric described above for gate contact openings. For example, large and small gate contact openings may be defined with the larger contact openings merging with adjacent terminal contact via openings. In still other embodiments, large and small gate contact openings may be defined along with large and small terminal contact via openings with only some combination of those size differences resulting in a merge of a terminal contact via openings and a neighboring gate contact opening. The ordering of these patterning operations may also be reversed from that illustrated in FIGS. 5B and 5C. Also, metal may be deposited in the openings concurrently as illustrated in FIG. 5D, or a first metal deposition may be performed after forming first openings, and a second metal deposition performed after forming second openings.

Figure 5E:
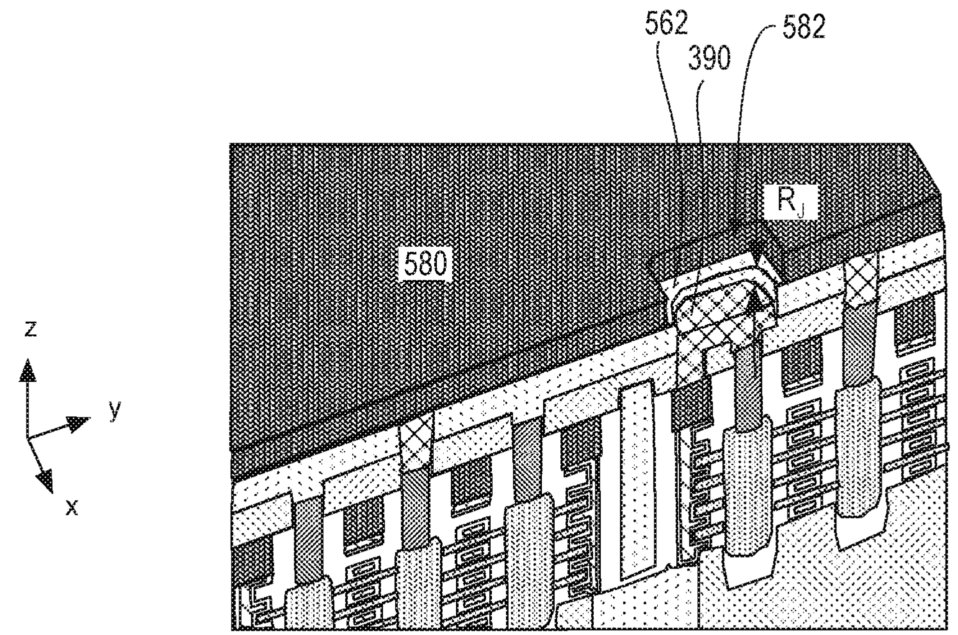

Returning to FIG. 4, methods 400 continue at block 480 where the jumper metallization is recessed relative to other gate contact metallizations and other terminal contact metallizations. This selective recession may be performed with an etch mask patterned with relaxed lithography that positions an opening in the mask over the jumper metallization. An etch process suitable for recessing the jumper metallization is then performed for a predetermined time. In the example further illustrated in FIG. 5E, an etch mask 580 is over dielectric material 562 as well as protected contact and via metallization. Etch mask 580 includes an opening 582 that exposes all of jumper metallization 390. Following an etch process suitable for the composition of jumper metallization 390, a top surface of jumper metallization 390 is recessed below a top surface of dielectric material 562 by a recess height (depth) $R_J$.

Figure 5F:
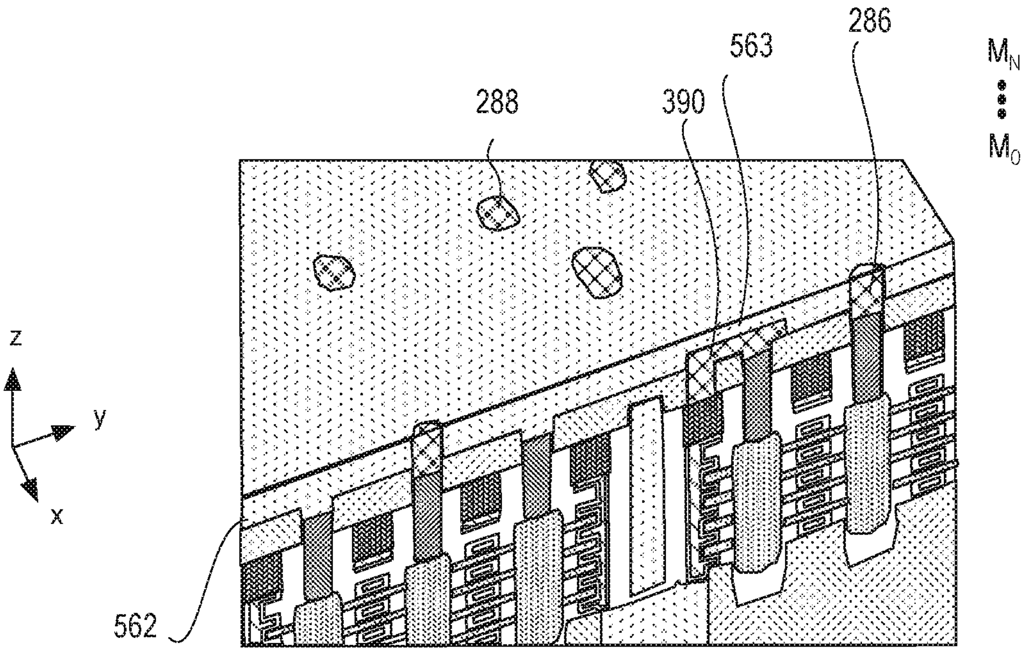

Methods 400 (FIG. 4) continue at block 490 where a dielectric material is deposited over the jumper metallization. That dielectric material may be planarized to expose again gate contact metallization and terminal contact via metallization. Such planarization will retain dielectric material over the jumper metallization since jumper metallization was recessed. Methods 400 then end at output 499 where the IC is completed, for example with the formation of any number of interconnect metallization levels. In the example illustrated in FIG. 5F, dielectric material 563 has been deposited over jumper metallization 390 and planarized with top surfaces of terminal contact via metallization 286 and gate contact metallization 288. In some embodiments, dielectric material 563 has substantially the same composition as dielectric material 562. Any number of metallization levels $M_0$-$M_N$ may be formed over dielectric material 563.

Figure 6:
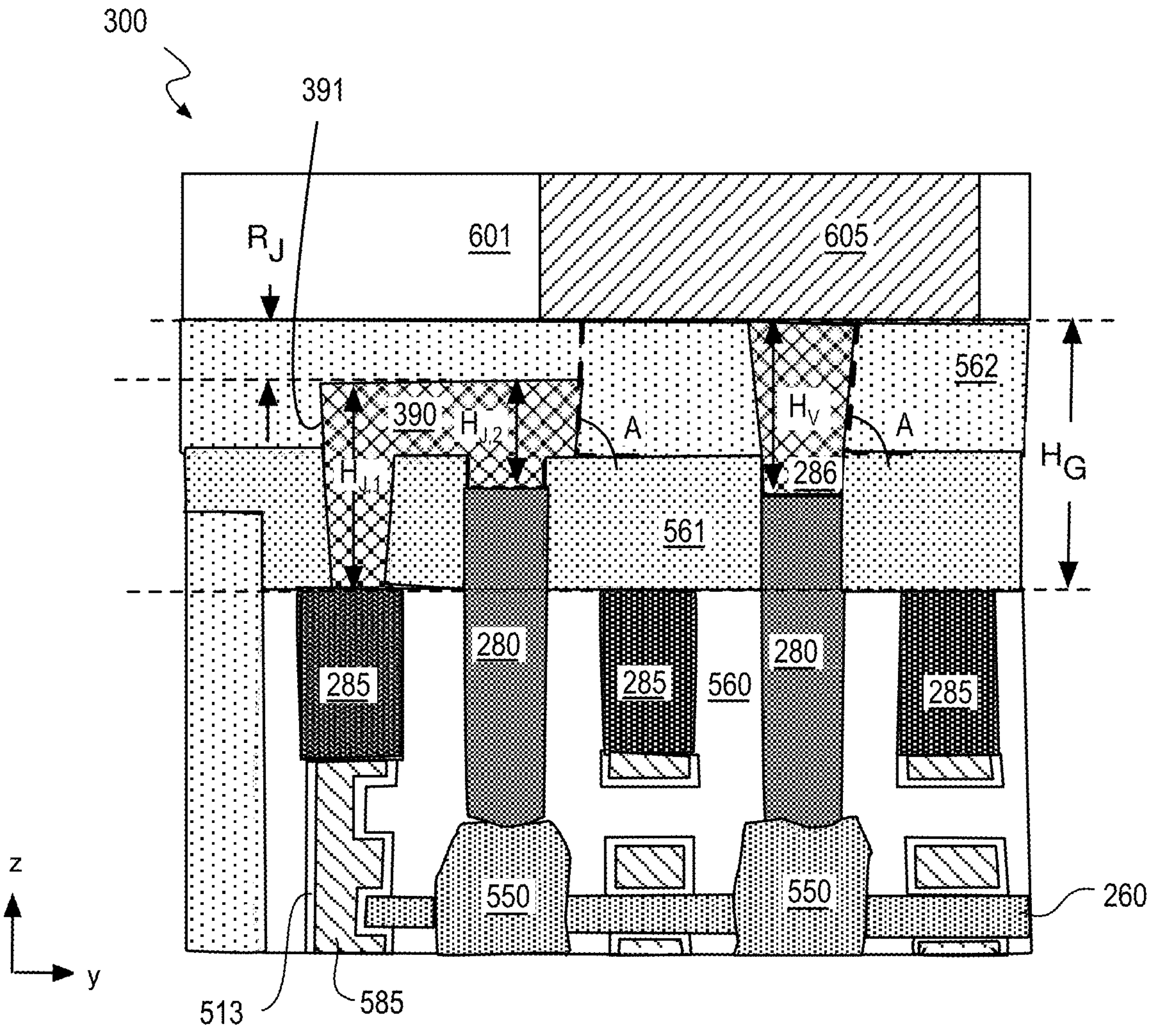
FIG. 6, is an expanded cross-sectional view of transistor structures interconnected by terminal jumper metallization, accordance with some embodiments.

FIG. 6 is an expanded view of transistor structures interconnected by terminal jumper metallization, for example substantially as described above, and that are elements of the SRAM layout 300 (FIG. 3). As shown in FIG. 6, gate electrode 285 coupled to a first pull-up transistor is interconnected to a source/drain 550 of a second pull-up transistor by jumper metallization 390. Jumper metallization is recessed by a recess amount $R_J$ relative to a height $H_V$ of terminal contact via metallization 286. Dielectric material over jumper metallization 390 electrically insulates jumper metallization 390 from an overlying interconnect line metallization 605 that is in contact with terminal contact via metallization 286. Because of the recess, a top surface of jumper metallization 390 has a height $H_{J,1}$ from a top surface of source/drain terminal contact metallization 280, which is smaller than terminal contact via height $H_v$. Similarly, gate contact metallization (not depicted) will have a height HG from a top surface of gate electrodes 285, while the top of jumper metallization 390 has a smaller height $H_{GJ}$ from the top surface of gate electrodes 285.

As further illustrated in FIG. 6, jumper metallization 390 has a sidewall 391 with a reentrant slope associated with a sidewall angle A that is less than 90 degrees from the plane of the workpiece or plane of a top surface of dielectric material 561. A top of jumper metallization 390 therefore has a larger lateral dimension (e.g., along y-axis) than a bottom of the jumper metallization. Sidewall angle A may be 80-85 degrees, for example, and is indicative of jumper metallization 390 having been defined by openings in dielectric materials 561, 562 which were backfilled with metallization. Had jumper metallization 390 instead been subtractively patterned from a continuous layer of metallization, sidewall angle would instead be positively sloped (i.e., larger than 90 degrees) and a bottom of the jumper metallization would be a larger lateral dimension than a top of the jumper metallization.

Transistor structures with gate electrodes and source/drain contact metallization interconnected through a jumper metallization may be integrated into a wide variety of ICs and computing systems that include such ICs. SRAM bit-cells with a pull-up transistor structure having a gate electrode interconnected to a source/drain contact metallization of another pull-up transistor may be similarly integrated into a wide variety of ICs and computing systems that include such ICs.

Figure 7:
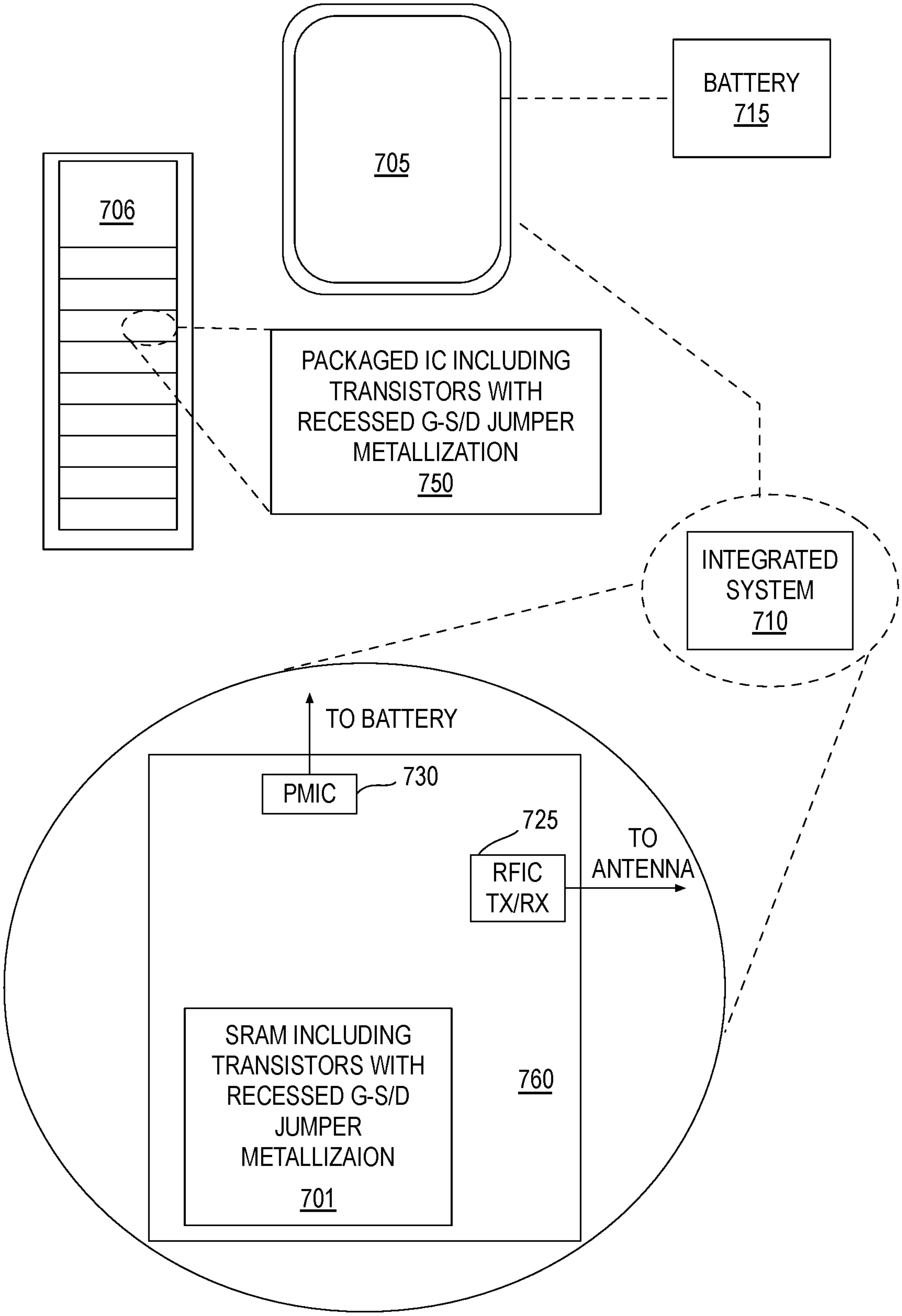
FIG. 7 illustrates a mobile computing platform and a data server machine employing an IC that includes transistors interconnected by terminal jumper metallization, in accordance with some embodiments.

FIG. 7 illustrates a mobile computing platform 705 and a data server computing platform 706 employing a packaged IC including an SRAM with pull-up transistors interconnected by a gate-source/drain jumper metallization, for example substantially as described elsewhere herein. The server platform 706 may be any commercial server, for example including any number of high-performance computing platforms disposed within a rack and networked together for electronic data processing, which in the exemplary embodiment includes a packaged IC 750 including an SRAM with pull-up transistors interconnected by a gate-source/drain jumper metallization, for example substantially as described elsewhere herein.

The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, or optical touchscreen), a chip-level or package-level integrated system 77, and a battery 715. At least one IC of chip-level or package-level integrated system 710 includes a packaged IC with an SRAM where pull-up transistors are interconnected by a gate-source/drain jumper metallization, for example substantially as described elsewhere herein.

In the example shown in the expanded view, integrated system 710 includes a microprocessor 701 that includes an SRAM where pull-up transistors are interconnected by a gate-source/drain jumper metallization, for example substantially as described elsewhere herein. Microprocessor 701 may be further coupled to a host substrate 760. One or more of a power management integrated circuit (PMIC) 730 or an RF (wireless) integrated circuit (RFIC) 725 including a wideband RF (wireless) transmitter and/or receiver (TX/RX) may be further coupled to host substrate 760.

Functionally, PMIC 730 may perform battery power regulation, DC-to-DC conversion, etc., and so has an input coupled to battery 715 and with an output providing a current supply to other functional modules (e.g., microprocessor 701). As further illustrated, in the exemplary embodiment, RFIC 725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 4G, 5G, and beyond.

Figure 8:
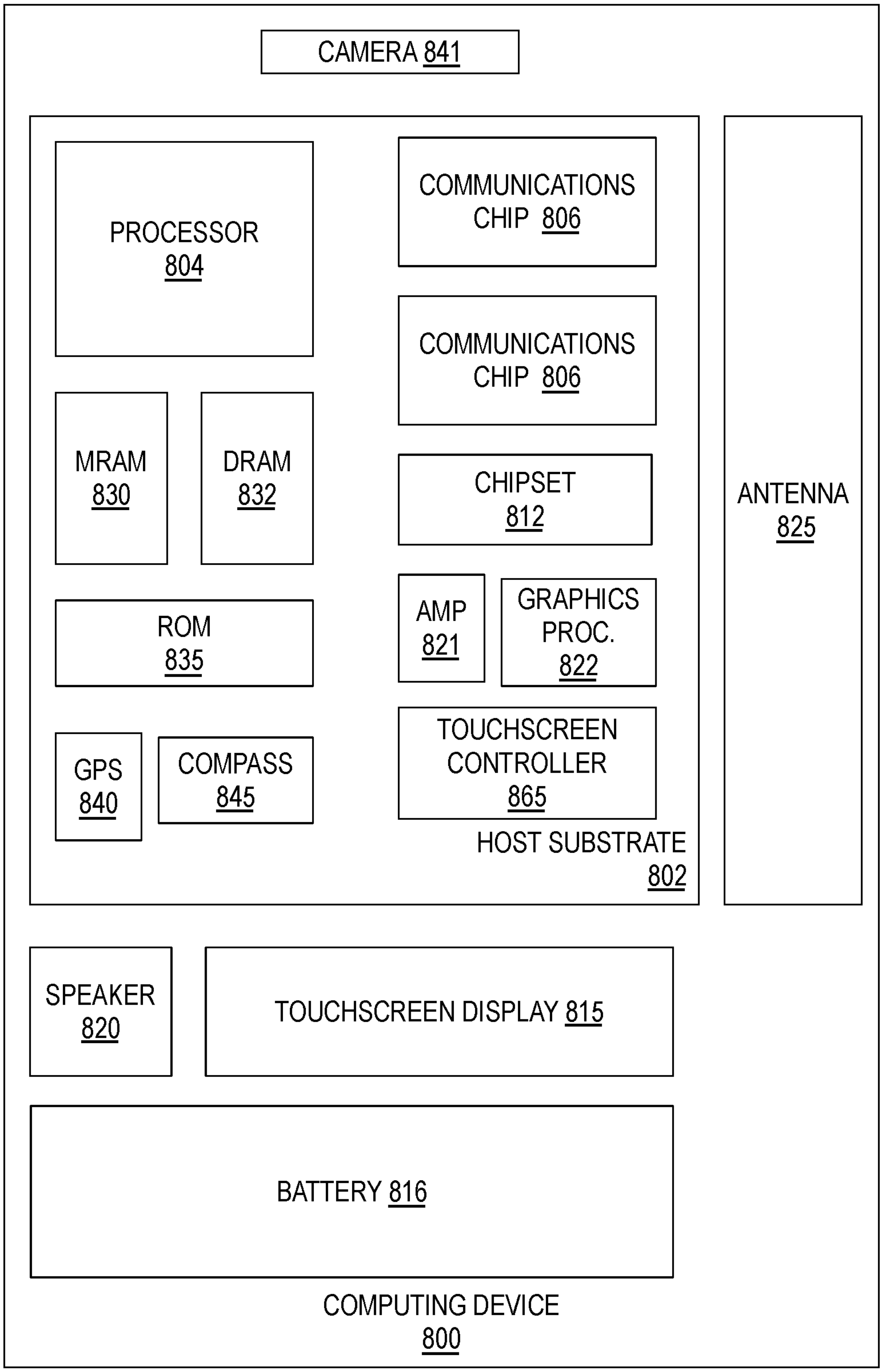
FIG. 8 is a functional block diagram of an electronic computing device, in accordance with some embodiments.

FIG. 8 is a functional block diagram of an electronic computing device 800, in accordance with an embodiment of the present invention. Computing device 800 may be found inside platform 1005 or server platform 1006, for example. Device 800 further includes a host substrate 802 hosting a number of components, such as, but not limited to, a processor 804 (e.g., an applications processor with an arithmetic logic unit). Processor 804 may be physically and/or electrically coupled to host substrate 802. In some examples, processor 804 includes transistor structures with gate electrodes and source/drain contact metallization interconnected through a jumper metallization, for example as described elsewhere herein. In some more specific examples, an SRAM includes bit-cells where two pull-up transistors are interconnected through a gate electrode-source/drain contact jumper metallization. In general, the term “processor” or “microprocessor” may refer to any device or portion of a device that processes electronic data from registers and/or memory to transform that electronic data into other electronic data that may be further stored in registers and/or memory.

In various examples, one or more communication chips 806 may also be physically and/or electrically coupled to the host substrate 802. In further implementations, communication chips 806 may be part of processor 804. Depending on its applications, computing device 800 may include other components that may or may not be physically and electrically coupled to host substrate 802. These other components include, but are not limited to, volatile memory (e.g., DRAM 832), non-volatile memory (e.g., ROM 835), flash memory (e.g., NAND or NOR), magnetic memory (MRAM 830), a graphics processor 822, a digital signal processor, a crypto processor, a chipset 812, an antenna 825, touchscreen display 815, touchscreen controller 865, battery 816, audio codec, video codec, power amplifier 821, global positioning system (GPS) device 840, compass 845, accelerometer, gyroscope, speaker 820, camera 841, and mass storage device (such as hard disk drive, solid-state drive (SSD), compact disk (CD), digital versatile disk (DVD), and so forth), or the like. In some exemplary embodiments, at least one of the functional blocks noted above includes transistor structures with gate electrodes and source/drain contact metallization interconnected through a jumper metallization, for example as described elsewhere herein.

Communication chips 806 may enable wireless communications for the transfer of data to and from the computing device 800. The term "wireless" and its derivatives may be used to describe circuits, devices, systems, methods, techniques, communications channels, etc., that may communicate data using modulated electromagnetic radiation through a non-solid medium. The term does not imply that the associated devices do not contain any wires, although in some embodiments they might not. Communication chips 806 may implement any of many wireless standards or protocols, including but not limited to those described elsewhere herein. As discussed, computing device 800 may include a plurality of communication chips 806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

It will be recognized that scope of the disclosure is not limited to the exemplary embodiments described in detail but can be practiced with modification and alteration without departing from the scope of the appended claims. For example, the above embodiments may include specific combinations of features as further provided below.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. An integrated circuit (IC) device structure comprising:
- one or more gate electrodes, each adjacent to a channel region comprising a semiconductor material;
- a source and a drain, each coupled to the semiconductor material, wherein one of the gate electrodes is between the source and the drain;
- a first terminal contact metallization in contact with a first of the source or drain;
- a second terminal contact metallization in contact with a second of the source or drain;
- a jumper metallization in contact with a top surface of a first of the gate electrodes and in contact with a top surface of the first terminal contact metallization;
- a dielectric material layer over the one or more gate electrodes, over the first terminal contact metallization, over the second terminal contact metallization, and over the jumper metallization;
- a line metallization over the dielectric material layer;
- a via metallization extending through the dielectric material layer, wherein the via metallization is in contact with the line metallization and in contact with the second terminal contact metallization and wherein the via metallization has the same composition as the jumper metallization; and
- a gate contact metallization in contact with one of the one or more gate electrodes, wherein a top surface of the gate contact metallization is coplanar with a top surface of the dielectric material layer, and wherein the first terminal contact metallization, the gate contact metallization and the jumper metallization have substantially the same composition.

2. An integrated circuit (IC) device structure comprising:
- one or more gate electrodes, each adjacent to a channel region comprising a semiconductor material;
- a source and a drain, each coupled to the semiconductor material, wherein one of the gate electrodes is between the source and the drain;
- a first terminal contact metallization in contact with a first of the source or drain;
- a second terminal contact metallization in contact with a second of the source or drain;
- a jumper metallization in contact with a top surface of a first of the gate electrodes and in contact with a top surface of the first terminal contact metallization;
- a first dielectric material layer over the one or more gate electrodes, over the first terminal contact metallization, over the second terminal contact metallization, and over the jumper metallization;
- a line metallization over the first dielectric material layer; and
- a via metallization extending through the first dielectric material layer, wherein the via metallization is in contact with the line metallization and in contact with the second terminal contact metallization;
- a second dielectric material layer under the first dielectric material layer, wherein a bottom surface of the second dielectric material layer is coplanar with a top surface of the one or more gate electrodes; and
- a third dielectric material layer over the first dielectric material layer, wherein the third dielectric material layer is adjacent to a sidewall of the line metallization.

3. The IC device structure of claim 2, wherein the first dielectric material layer has a different composition than the second dielectric material layer.

4. The IC device structure of claim 2, wherein the via metallization is a first via metallization, and wherein the jumper metallization comprises a second via metallization extending through the first dielectric material layer, the second via metallization landing on one of the one or more gate electrodes.

5. The IC device structure of claim 4, wherein the first terminal contact metallization is adjacent to a sidewall of the second dielectric material layer.

6. A static random-access memory (SRAM) bit-cell structure, comprising:
- a first pull-up transistor structure comprising a first source coupled with a first source contact metallization;
- a second pull-up transistor structure comprising a second source coupled with a second source contact metallization, and
- a line metallization extending over the first and second pull-up transistor structures, wherein the line metallization is interconnected to the first source contact metallization and the second source contact metallization through a via metallization that is in direct contact with the line metallization, and wherein:
  - a first jumper metallization interconnects a drain of the first pull-up transistor structure to a gate electrode of the second pull-up transistor structure;
  - a second jumper metallization interconnects a drain of the second pull-up transistor structure to a gate electrode of the first pull-up transistor structure; and
  - a top of the first and second jumper metallizations is at a first height that is below a second height of a top of the via metallization.

7. The SRAM bit-cell structure of claim 6, wherein:
the first pull-up transistor structure comprises:
a first channel region comprising a semiconductor material coupled to the gate electrode of the first pull-up transistor structure; and
a first drain contact metallization in contact with the drain of the first pull-up transistor structure; and
the second pull-up transistor structure comprises:
a second channel region comprising a semiconductor material coupled to the gate electrode of the second pull-up transistor structure; and
a second drain contact metallization in contact with the drain of the second pull-up transistor structure, wherein:
the first jumper metallization is in contact with the first drain contact metallization and in contact with the gate electrode of the second pull-up transistor structure; and
the second jumper metallization is in contact with the second drain contact metallization and in contact with the gate electrode of the first pull-up transistor structure.

8. The SRAM bit-cell structure of claim 7, wherein the via metallization has substantially the same composition as the first and second jumper metallizations.

9. The SRAM bit-cell structure of claim 8, wherein the first drain contact metallization and the second drain contact metallization have substantially the same composition as the first and second jumper metallizations.

10. The SRAM bit-cell structure of claim 8, wherein the via metallization extends through a thickness of a dielectric material layer that extends over the first and second jumper metallizations.

11. A static random-access memory (SRAM) bit-cell structure, comprising:
a first transistor structure comprising a first source contact metallization in contact with a first source terminal and a first drain contact metallization in contact with a first drain terminal;
a second transistor structure comprising a second source contact metallization in contact with a second source terminal and a second drain contact metallization in contact with a second drain terminal; and
a line metallization extending over the first and second transistor structures, wherein the line metallization is interconnected to the first and second transistor structures through a via metallization that is in direct contact with the line metallization, and wherein:
a first jumper metallization interconnects the first source contact metallization or first drain contact metallization to a gate electrode of the second transistor structure;
a second jumper metallization interconnects the second source contact metallization or the second drain contact metallization to a gate electrode of the first transistor structure; and
a top of the first and second jumper metallizations is at a first height, which is below a second height of a top of the via metallization.

12. The SRAM bit-cell structure of claim 11, further comprising a dielectric material layer under the line metallization and over the first and second jumper metallizations, the via metallization extending through the dielectric material layer.

13. The SRAM bit-cell structure of claim 11, wherein:
the first transistor structure is a first pull-up transistor structure; and
the second transistor structure is a second pull-up transistor structure.

* * * * *